US012560628B2

(12) United States Patent
Kim et al.

(10) Patent No.: US 12,560,628 B2
(45) Date of Patent: Feb. 24, 2026

(54) PROBE CARD

(71) Applicant: SAMSUNG ELECTRONICS CO., LTD., Suwon-si (KR)

(72) Inventors: Kyubeom Kim, Suwon-si (KR); Junoh Choi, Suwon-si (KR); Duhyun Hwang, Suwon-si (KR); Dongdae Kim, Suwon-si (KR); Youngil Kim, Gumi-si (KR); Jaehan Cho, Gumi-si (KR)

(73) Assignees: SAMSUNG ELECTRONICS CO., LTD., Suwon-si (KR); TOP Engineering Co., Ltd., Gumi-si (KR)

( * ) Notice: Subject to any disclaimer, the term of this patent is extended or adjusted under 35 U.S.C. 154(b) by 287 days.

(21) Appl. No.: 18/511,034

(22) Filed: Nov. 16, 2023

(65) Prior Publication Data

US 2024/0168059 A1      May 23, 2024

(30) Foreign Application Priority Data

Nov. 18, 2022      (KR) ........................ 10-2022-0155483

(51) Int. Cl.
| *G01R 1/073* | (2006.01) |
| *G01R 1/04* | (2006.01) |
| *G01R 1/067* | (2006.01) |
| *G01R 31/02* | (2006.01) |
(Continued)

(52) U.S. Cl.
CPC ................................ *G01R 1/07342* (2013.01)

(58) Field of Classification Search
CPC .......... G01R 1/04; G01R 1/067; G01R 1/073; G01R 31/02; G01R 31/26; G01R 31/28
See application file for complete search history.

(56) References Cited

U.S. PATENT DOCUMENTS

| 5,644,246 A | 7/1997 | Lee et al. |
| 7,659,735 B2 | 2/2010 | Kim et al. |
| 2006/0290367 A1 | 12/2006 | Hobbs et al. |
(Continued)

FOREIGN PATENT DOCUMENTS

| EP | 2183603 B1 | 10/2012 |
| JP | 4166536 B2 | 10/2008 |
(Continued)

OTHER PUBLICATIONS

Communication dated Nov. 27, 2024, issued by the Korean Patent Office in Korean Applicaion No. 10-2022-0155483.

*Primary Examiner* — Neel D Shah
(74) *Attorney, Agent, or Firm* — Sughrue Mion, PLLC

(57) ABSTRACT

A probe card is provided. The probe card includes: a main circuit board defining an opening; a fixed core provided on a bottom surface of the main circuit board; a movable core provided adjacent the fixed core and configured to move through the opening along a vertical direction; and a driver provided on an upper surface of the main circuit board and configured to control the movable core to move along the vertical direction. The driver includes a driving source provided on an installation portion of the main circuit board, and a power transmission member connected to the driving source and including a roller configured to contact the movable core, and the driver is configured to move the movable core to control whether the fixed core or the movable core is electrically connected to a product, according to a type of the product.

20 Claims, 10 Drawing Sheets

100

(51) Int. Cl.
　　 *G01R 31/26* 　　　　 (2020.01)
　　 *G01R 31/28* 　　　　 (2006.01)

(56) 　　　　　　　　 References Cited

U.S. PATENT DOCUMENTS

| | | | | | |
|---|---|---|---|---|---|
| 2008/0150559 | A1* | 6/2008 | Nayak | ................ | G01R 31/2887 |
| | | | | | 324/750.19 |
| 2008/0164893 | A1* | 7/2008 | Lee | .................... | G01R 1/07342 |
| | | | | | 324/754.07 |
| 2013/0015440 | A1 | 1/2013 | Dang et al. | | |
| 2017/0131348 | A1 | 5/2017 | Dau et al. | | |
| 2022/0018898 | A1 | 1/2022 | Nakayama | | |

FOREIGN PATENT DOCUMENTS

| | | | |
|---|---|---|---|
| JP | 2011-228427 | A | 11/2011 |
| KR | 10-1997-0046793 | A | 7/1997 |
| KR | 20-0210931 | Y1 | 1/2001 |
| KR | 10-2006-0016827 | A | 2/2006 |
| KR | 10-0676824 | B1 | 2/2007 |
| KR | 10-0688582 | B1 | 3/2007 |
| KR | 10-2008-0032110 | A | 4/2008 |
| KR | 10-0843224 | B1 | 7/2008 |
| KR | 10-2008-0112632 | A | 12/2008 |
| KR | 10-2010-0055483 | A | 5/2010 |
| KR | 10-2010-0082220 | A | 7/2010 |
| KR | 10-1535726 | B1 | 7/2015 |
| KR | 10-2406863 | B1 | 6/2022 |
| KR | 10-2808414 | B1 | 5/2025 |

* cited by examiner

PROBE CARD

CROSS-REFERENCE TO RELATED APPLICATION

This application claims priority to Korean Patent Application No. 10-2022-0155483, filed on Nov. 18, 2022, in the Korean Intellectual Property Office, the disclosure of which is incorporated by reference herein in its entirety.

BACKGROUND

The present disclosure relates to a probe card.

Related probe cards for testing semiconductor chips have one core. Devices to be tested may have different pad spacings and configurations, and in this regard various probe cards manufactured for the respective products are necessary for testing. Therefore, in order to conduct an electrical test of another product in one facility, a probe card replacement operation is required.

SUMMARY

One or more example embodiments provide a probe card capable of performing a test when testing electrical characteristics of different products without replacement of the probe card.

According to an aspect of an example embodiment, a probe card includes: a main circuit board defining an opening; a fixed core provided on a bottom surface of the main circuit board; a movable core provided adjacent the fixed core and configured to move through the opening along a vertical direction; and a driver provided on an upper surface of the main circuit board and configured to control the movable core to move along the vertical direction. The driver includes a driving source provided on an installation portion of the main circuit board, and a power transmission member connected to the driving source and including a roller configured to contact the movable core, and the driver is configured to move the movable core to control whether the fixed core or the movable core is in contact with a product, according to a type of the product.

According to an aspect of an example embodiment, a probe card includes: a main circuit board including a plurality of channels spaced apart from each other in a circumferential direction; a fixed core fixedly provided on a bottom surface of the main circuit board and electrically connected to the plurality of channels; a movable core electrically connected to the plurality of channels, provided adjacent the fixed core, and configured to move along a vertical direction; and a driver connected to the movable core and configured to control the movable core to move along the vertical direction. The driver is configured to move the movable core to control whether the fixed core or the movable core is in contact with a product, according to a type of the product, and at least one of the plurality of channels is connected to both the fixed core and the movable core.

According to an aspect of an example embodiment, a probe card includes: a main circuit board defining a first opening and a second opening; a fixed core provided on a bottom surface of the main circuit board; a first movable core provided adjacent the fixed core and configured to move through the first opening along a vertical direction; a first driver provided on an upper surface of the main circuit board and configured to control the first movable core to move along the vertical direction; a second movable core provided adjacent the fixed core and configured to move through the second opening along the vertical direction; and a second driver provided on the upper surface of the main circuit board and configured to control the second movable core to move along the vertical direction. The first driver includes a first driving source provided on an installation portion of the main circuit board, and a first power transmission member connected to the first driving source and including a first roller configured to contact the first movable core. The second driver includes a second driving source provided on the installation portion of the main circuit board, and a second power transmission member connected to the second driving source and including a second roller configured to contact the second movable core. The first driver and the second driver are configured to move the first movable core and the second movable core to control whether the fixed core, the first movable core or the second movable core is in contact with the product.

BRIEF DESCRIPTION OF DRAWINGS

The above and other aspects and features will be more apparent from the following description of example embodiments, taken in conjunction with the accompanying drawings, in which.

DETAILED DESCRIPTION

Hereinafter, example embodiments will be described with reference to the accompanying drawings. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
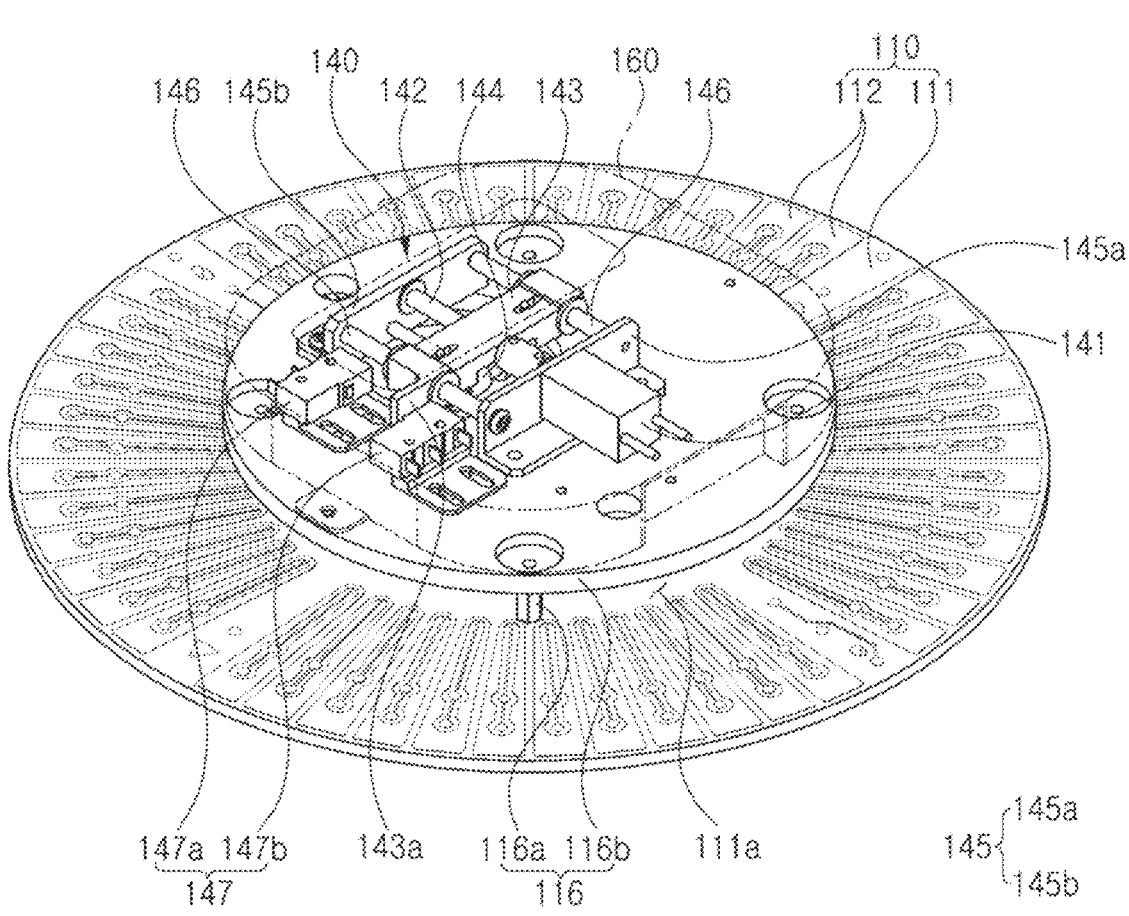
FIG. 1 is a perspective view illustrating a probe card according to an example embodiment.
Figure 2:
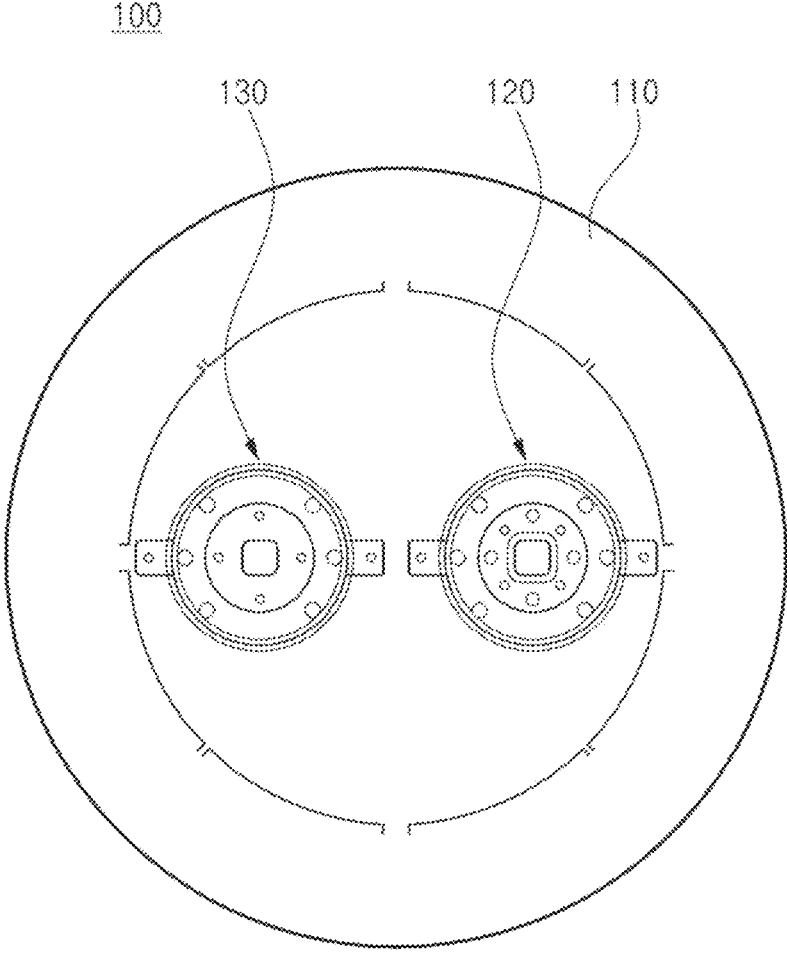
FIG. 2 is a bottom view illustrating a probe card according to an example embodiment.

FIG. 1 is a perspective view illustrating a probe card according to an example embodiment, and FIG. 2 is a bottom view illustrating a probe card according to an example embodiment.

Referring to FIGS. 1 and 2, a probe card 100 according to an example embodiment includes a main circuit board 110, a fixed core 120 (refer to FIG. 2), a movable core 130 (refer to FIG. 2), and a driving unit (e.g., a driver) 140. The probe card 100 may have a round shape. For example, probe card 100 may have a circular shape.

On an upper surface of the main circuit board 110, a plurality of channels 112 are disposed to be spaced apart from each other in a circumferential direction. Each of the plurality of channels 112 may be formed of a conductive material. As an example, 48 channels 112 may be provided. Among the 48 channels 112, 44 channels 112 may be used for testing, and four channels may be used for driving the driving unit 140. Also, the main circuit board 110 may include a body 111 formed of an insulator and having a circular plate shape and a plurality of channels 112 formed of a conductive material on an upper surface of the body 111. The plurality of channels 112 may extend radially from the center of the body 111 to the outside of a circular insulating portion 111a. Here, the radial direction refers to a direction from the center of the body 111 toward the edge of the body 111, and a circumferential direction refers to a direction in which rotation is made along the side of the body 111. The main circuit board 110 may include an installation portion 116 for installation of the driving unit 140. As an example, the installation portion 116 may include a plurality of installation pillars 116a and a cover 116b having a circular plate shape connected to the installation pillars 116a. The cover 116b may include a through-hole 116b-1 through which the movable core 130, which will be described below, is exposed.

The main circuit board 110 includes a mounting member 118 in which the movable core 130 is installed to be lifted, and the mounting member 118 is installed around an opening 114 defined in the main circuit board 110. The mounting member 118 may include a fixed portion 118a fixed to the main circuit board 110 and a lifting portion 118c connected to the fixed portion 118a via a first elastic member 118b. In addition, the movable core 130 may be installed in the lifting portion 118c and moved up and down.

The fixed core 120 is fixedly installed on the main circuit board 110 and electrically connected to the channel 112 provided on the main circuit board 110. The fixed core 120 may include a spring loaded pin, such as a pogo pin for electrical connection with a wafer for a flash memory as a test object. 44 pogo pins may be provided for electrical connection with a wafer for the flash memory. Here, a case in which the test object to be tested through the fixed core 120 is a wafer for the flash memory is described as an example, but example embodiments are not limited thereto and the test object to be tested through the fixed core 120 may be a wafer for dynamic random-access memory (DRAM). The fixed core 120 may be disposed to protrude from a lower surface of the main circuit board 110.

Figure 5:
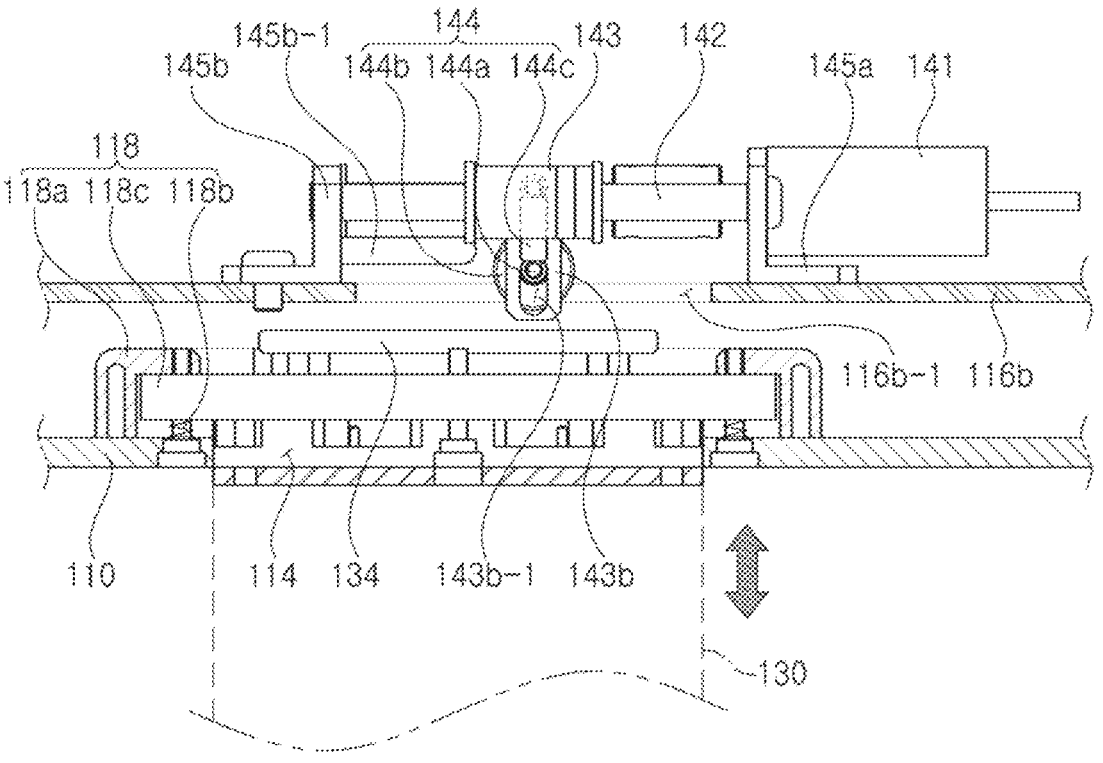
FIG. 5 is a view illustrating a driving unit and a movable core of a probe card according to an example embodiment.

The movable core 130 is liftably installed on the main circuit board 110 and is connected to the driving unit 140. The movable core 130 is electrically connected to the channel 112 provided on the main circuit board 110, and may include a pogo pin for electrical connection with a wafer for DRAM to be tested. 24 pogo pins may be provided for electrical connection with the wafer for DRAM. As shown in FIG. 5, the movable core 130 may be disposed to pass through the opening 114 provided in the main circuit board 110. For example, when pressed by the driving unit 140, the movable core 130 may descend downwardly through the opening 114, and when the pressing force by the driving unit 140 is removed, the movable core 130 may move upwardly.

As described above, when the movable core 130 is installed on the mounting member 118 of the main circuit board 110 and is pressed by the driving unit 140, the movable core 130 may descend together with the lifting portion 118c, and when the pressing force is removed by the driving unit 140, the movable core 130 is raised by restoring force of the first elastic member 118b of the mounting member 118.

In addition, a contact plate 134 (refer to FIGS. 4 and 5) pressed by the driving unit 140 may be provided on an upper surface of the movable core 130. The contact plate 134 may serve to prevent breakage of the movable core 130 due to pressing force. For example, the contact plate 134 may distribute the pressing force throughout the movable core 130.

A distance by which the movable core 130 is moved up and down by the driving unit 140 may be approximately 400 μm to 500 μm. If the distance by which the movable core 130 is moved up and down by the driving unit 140 is less than 400 μm, there is a risk that both the movable core 130 and the fixed core 120 may be connected to the wafer, which is a product, and if the distance by which the movable core 130 is moved up and down by the driving unit 140 is greater than 400 μm, a lifting distance of the movable core 130 becomes long, so there is a risk that the movable core 130 may not be smoothly connected to the wafer, and furthermore, the movable core 130 may be inclined and moved up and down. In addition, an overall height of the probe card 100 may increase if the lifting distance increases. A height difference between a bottom surface of the fixed core 120 and a bottom surface of the movable core 130 may be 1000 μm or less regardless of whether the movable core 130 moves up or down. If the height difference between the bottom surface of the fixed core 120 and the bottom surface of the movable core 130 is greater than 1000 μm, the overall height of the probe card 100 may increase, and in this case, because the distance by which the movable core 130 moves up and down may need to be increased, there is a risk that the wafer, which is a product, may not be smoothly electrically connected to the movable core 130. Therefore, the height difference between the bottom surface of the fixed core 120 and the bottom surface of the movable core 130 is set to 1000 μm or less.

Figure 3:
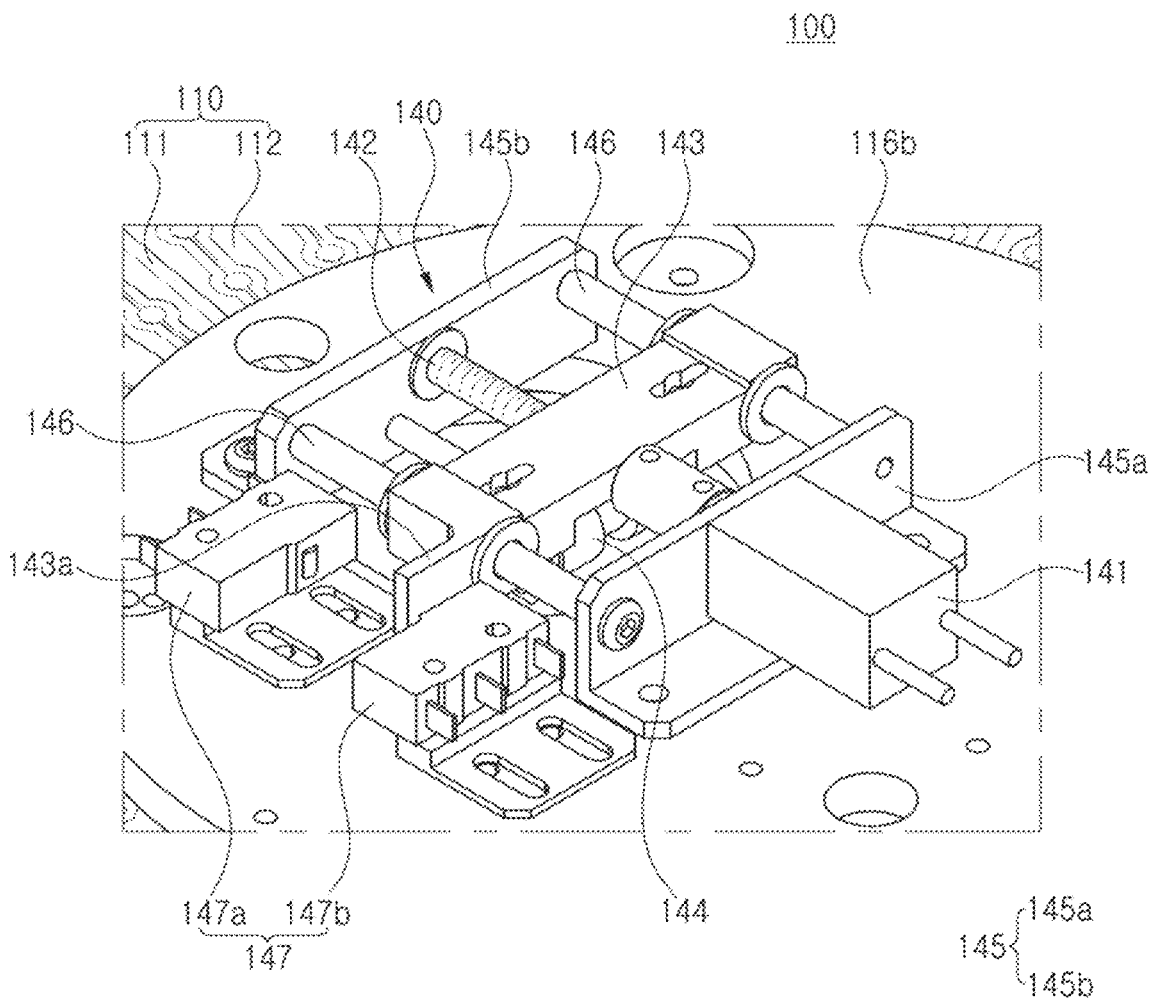
FIG. 3 is a perspective view illustrating a driving unit of a probe card according to an example embodiment.
Figure 4:
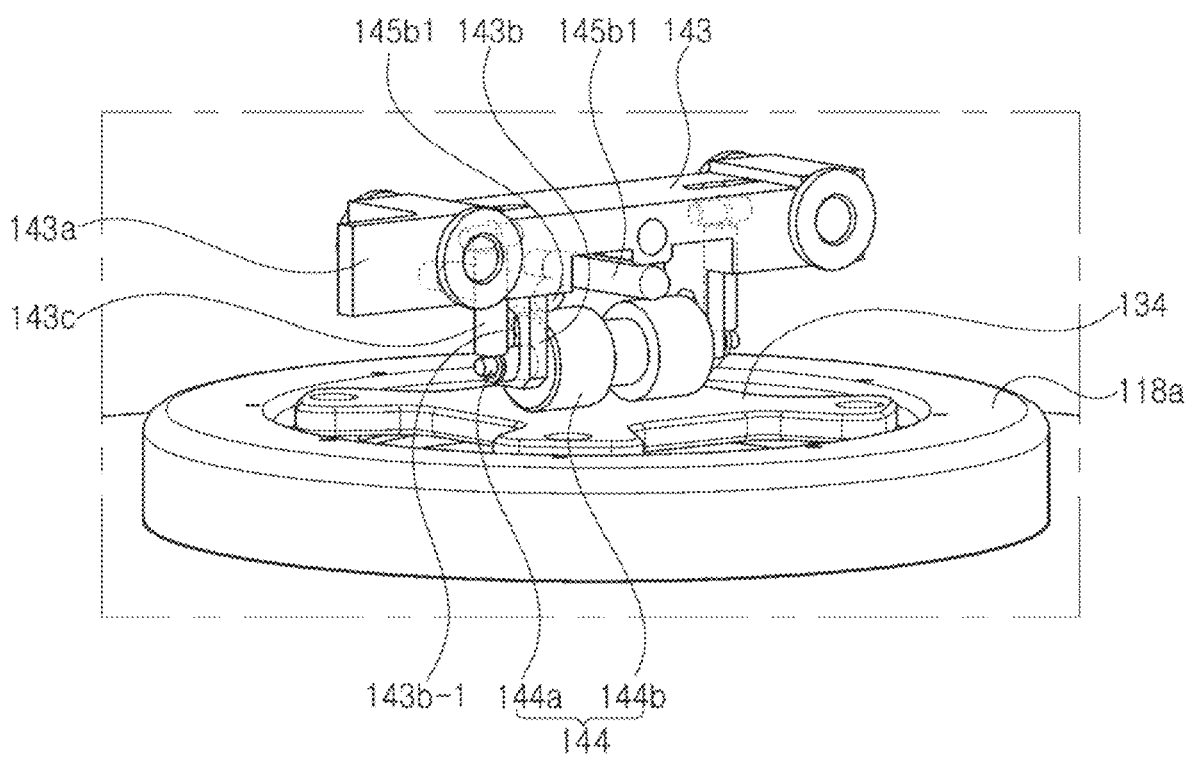
FIG. 4 is a perspective view illustrating a third power transmission member provided in a driving unit of a probe card according to an example embodiment.

The driving unit 140 is installed in the main circuit board 110 to lift the movable core 130. As an example, as shown in FIGS. 3 to 5 in detail, the driving unit 140 may include a driving source 141 generating driving force and a power transmission member connected to the driving source 141 and transmitting driving force to the movable core 130. As an example, the power transmission member may include a first power transmission member 142 connected to the driving source 141 and transmitting driving force, a second power transmission member 143 connected to the first power transmission member 142 and moving forwards and backwards by the driving source 141, and a third power transmission member 144 connected to the second power transmission member 143 and pressing the movable core 130.

As an example, the driving source 141 may be a DC motor capable of forward rotation and reverse rotation. However, example embodiments are not limited thereto, and the driving source 141 may be formed of a cylinder and may move the second power transmission member 143 forwards and backwards. For example, the driving source 141 may include an actuator.

The first power transmission member 142 may be formed of a screw connected to the driving source 141 and rotated. As an example, when the driving source 141 formed of a DC motor rotates in a first direction (i.e., forwards), the first power transmission member 142 may rotate forwards, and when the driving source 141 formed of a DC motor rotates in a second direction (i.e., reverse), the first power transmission member 142 may rotate reversely. In this manner, as the first power transmission member 142 rotates forwards and backwards, the second power transmission member 143 may move forwards and backwards.

The second power transmission member 143 may have a substantially rectangular parallelepiped shape, the first power transmission member 142 may be coupled to one end of the second power transmission member. The second power transmission member 143 may move forwards and backwards according to rotation of the first power transmission member 142. As shown in more detail in FIG. 5, a mounting portion 143b extending for installation of the third power transmission member 144 may be provided on a bottom surface of the second power transmission member 143. In addition, the second power transmission member 143 may include an extension 143a extending from one side surface thereof. A detailed description of the mounting portion 143b and the extension 143a will be described below.

The third power transmission member 144 is installed on the mounting portion 143b of the second power transmission member 143. As an example, the third power transmission member 144 may include a shaft portion 144a disposed to pass through a mounting hole 143b-1 of the mounting portion 143b and a roller 144b rotatably installed on the shaft portion 144a. The shaft portion 144a may be connected to a second elastic member 144c having one end supported by the second power transmission member 143. Accordingly, when the second power transmission member 143 moves forwards and backwards, the third power transmission member 144 may move forwards and backwards together with the second power transmission member 143 and be lifted. A guide member 145b-1 lowering the roller 144b may be provided in the second frame 145b so that the third power transmission member 144 may press the movable core 130. Also, when the movable core 130 is pressed by the roller 144b of the third power transmission member 144, the movable core 130 may be lowered, and when the pressure by the roller 144b is removed from the movable core 130, the movable core 130 rises. In addition, because elastic force is provided by the second elastic member 144c, when the roller 144b does not press the movable core 130, the roller 144b may rise and may not be interfered with by the installation portion 118. Furthermore, because the movable core 130 is pressed by the rotated roller 144b, the roller 144b which moves forwards and backwards may be prevented from being caught on the side of the movable core 130 to stop the third power transmission member 144.

The driving unit 140 may further include a frame 145 fixed to the cover 116b of the installation portion 116. The frame 145 may include a first frame 145a spaced apart from a through-hole 116b-1 and provided with the driving source 141 installed thereon and a second frame 145b spaced apart from the first frame 145a and disposed to be adjacent to the first through-hole 116b-1. The first power transmission member 142 is rotatably installed on the first and second frames 145a and 145b. Accordingly, the first power transmission member 142 may be smoothly rotated by the driving source 141.

In addition, a guide bar 146 may be installed in the first frame 145a and the second frame 145b and disposed to be parallel to the first power transmission member 142 to guide the movement of the second power transmission member 143. It is illustrated that the guide bar 146 is disposed on both sides of the first power transmission member 142, but example embodiments are not limited thereto, and the guide bar 146 may be disposed only on one side of the first power transmission member 142.

The driving unit 140 may include a sensor 147 disposed on a side surface of the second power transmission member 143 and contacting the extension 143a of the second power transmission member 143 when the second power transmission member 143 moves forwards. As an example, the sensor 147 may be an ON/OFF sensor detecting whether the extension 143a is contacted or separated. However, example embodiments are not limited thereto, and the sensor 147 may be modified to various sensors capable of detecting a position of the second power transmission member 143. Accordingly, when the second power transmission member 143 moves by a certain distance, the movement of the second power transmission member 143 may be stopped as the extension 143a contacts the sensor 147. To this end, the sensor 147 may be connected to a controller, and when the extension 143a contacts the sensor 147, the controller may stop the driving of the driving source 141.

As an example, the sensor 147 may include a first sensor 147a for detecting a position of the second power transmission member 143 which has moved forwards and a second sensor 147b for detecting a position of the second power transmission member 143 which has been moved backwards. For example, the first sensor 147a may be a contact sensor, and the second sensor 147b may be a contact sensor.

In some example embodiments, the driving unit 140 may include first and second stoppers installed on the first and second frames 145a and 145b instead of, or in addition to, the sensor 147. As an example, the first stopper may serve to limit the backward movement of the second power transmission member 143 when the second power transmission member 143 moves backwards, and the second stopper may serve to limit the forward movement of the second power transmission member 143 when the second power transmission member 143 moves forwards.

In this regard, the sensor 147 and the first and second stoppers may be selectively provided in the driving unit 140. In this regard, when the sensor 147 is provided in the driving unit 140, the first and second stoppers may be omitted, and when the first and second stoppers are provided in the driving unit 140, the sensor 147 may be omitted.

When the movable core 130 is lowered due to a pressing force provided by the driving unit 140, a lower surface of the movable core 130 is located to be lower than a lower surface of the fixed core 120 and is electrically connected to a wafer for testing. When the pressing force by the driving unit 140 is removed and the movable core 130 returns to an original position thereof, the lower surface of the fixed core 120 is located to be lower than the lower surface of the movable core 130. Accordingly, the fixed core 120 is electrically connected to the wafer for testing.

Further, a housing 160 may be additionally provided on the upper surface of the main circuit board 110 so that the driving unit 140 may be disposed therein. As an example, the housing 160 may be fixedly installed on the cover 116b of the installation portion 116. Also, the housing 160 may have a box shape with an open bottom so that the driving unit 140 may be disposed therein.

Hereinafter, the operation of the probe card will be briefly described.

When the controller determines that a first product, that is, a wafer for flash memory, is to be electrically tested, the controller performs the electrical test on the first product through the fixed core 120 while the fixed core 120 is in direct contact with the first product and the movable core 130 is separated from the first product, without driving the driving unit 140.

Figure 6:
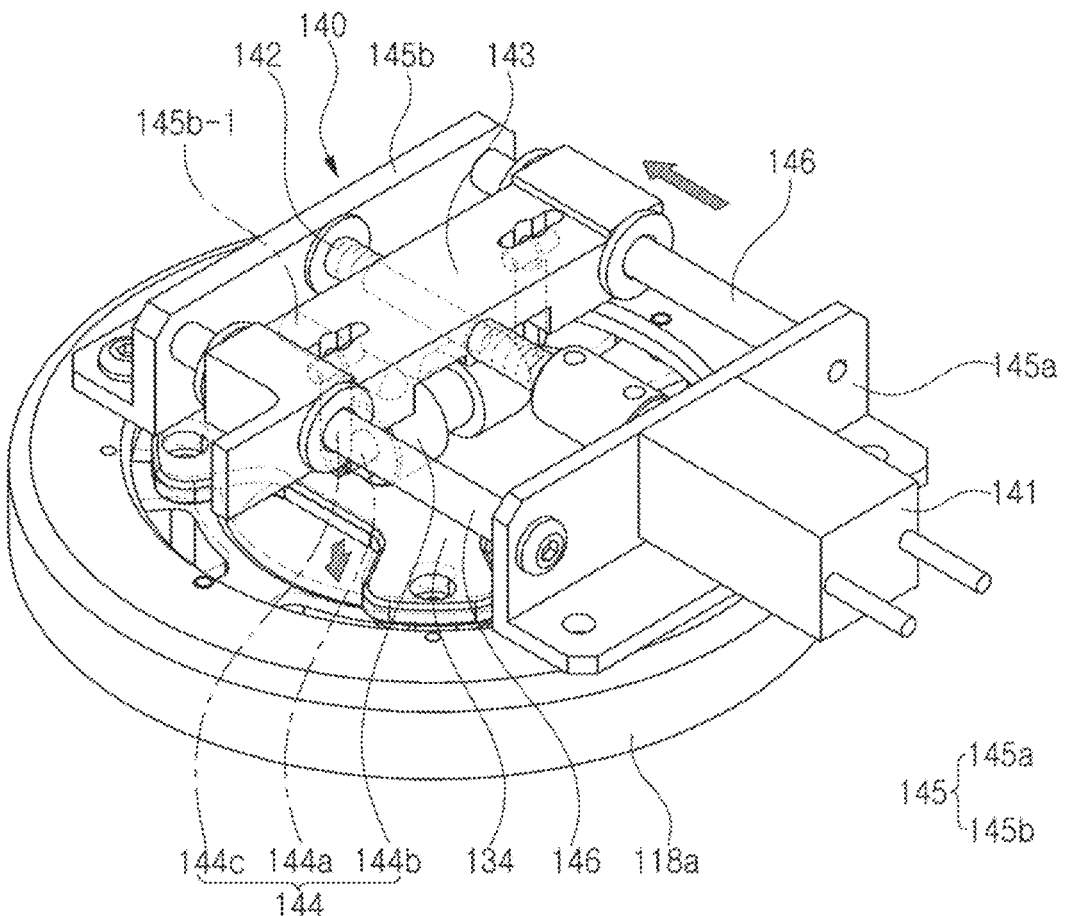
FIGS. 6 to 9 are views illustrating a driving method of a probe card according to an example embodiment.
Figure 7:
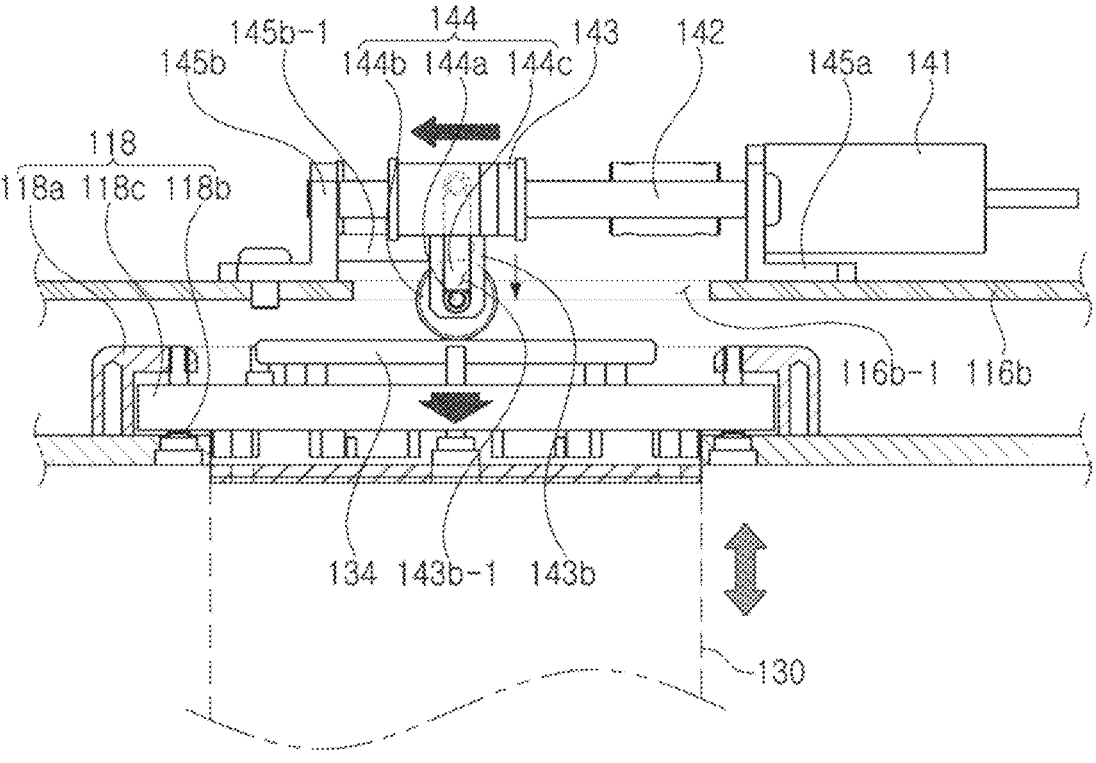

In addition, when the controller determines that a second product, such as a wafer for DRAM, is to be electrically tested, the controller drives the driving unit 140. At this time, the controller drives the driving unit 140 so that the driving source 141 of the driving unit 140 rotates forwards. Accordingly, as the first power transmission member 142 connected to the driving source 141 rotates forwards, the second power transmission member 143 moves forwards as shown in FIGS. 6 and 7. Thereafter, the movable core 130 is pressed by the third power transmission member 144 installed on the second power transmission member 143. At this time, the movable core 130 is lowered as the roller 144b of the third power transmission member 144 comes into contact with the contact plate 134 of the movable core 130. Thereafter, when the extension 143a of the second power transmission member 143 contacts the sensor 147 (refer to FIGS. 1 and 3), the controller stops the driving of the driving source 141 in response to a signal from the sensor 147 and conducts an electrical test on the second product through the movable core 130 while the fixed core 120 is separated from the second product and the movable core 130 is in direct contact with the second product.

Figure 8:
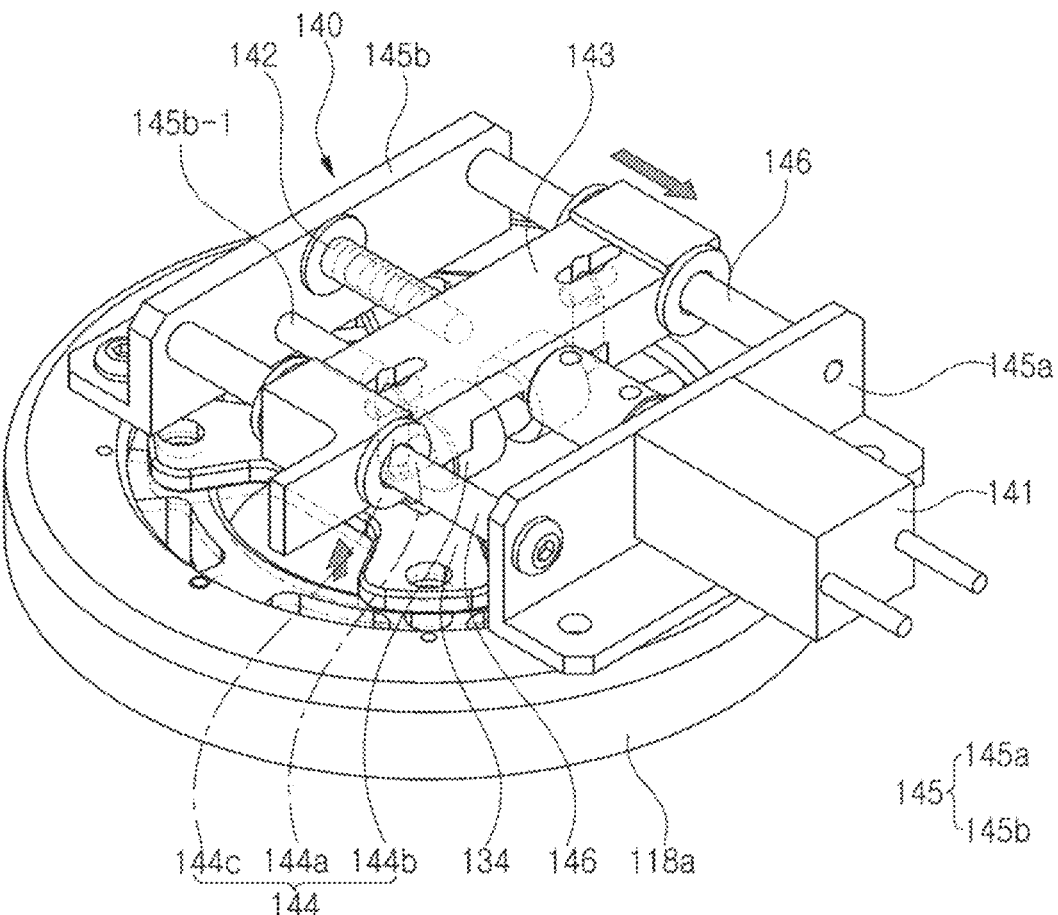
Figure 9:
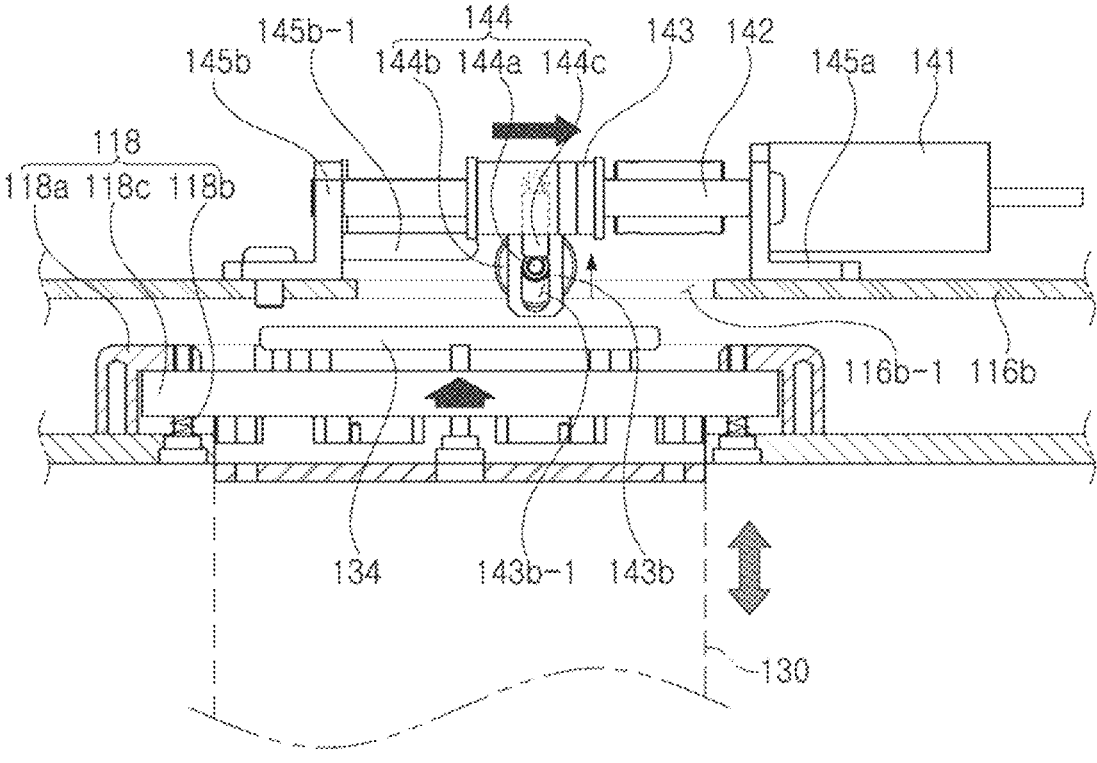

Thereafter, when the electrical test of the second product is completed and the controller determines that an electrical test of the first product is to be performed, the controller drives the driving unit 140. At this time, the controller drives the driving source 141 to rotate reversely. Accordingly, as the first power transmission member 142 connected to the driving source 141 reversely rotates, the second power transmission member 143 moves backwards as shown in FIGS. 8 and 9. Thereafter, when the extension 143a of the second power transmission member 143 contacts the sensor 147 (refer to FIGS. 1 and 3), the controller stops the driving of the driving source 141 in response to a signal from the sensor 147. Accordingly, the pressing force applied to the movable core 130 by the third power transmission member 144 installed on the second power transmission member 143 is removed. Also, when the pressing force applied to the movable core 130 by the second power transmission member 143 is removed, the movable core 130 is lifted. Thereafter, when the lifting of the movable core 130 is completed, the controller performs an electrical test on the first product.

As described above, because electrical tests of a plurality of products may be performed through the probe card 100, electrical tests of a plurality of products may be performed without replacing the probe card 100.

Figure 10:
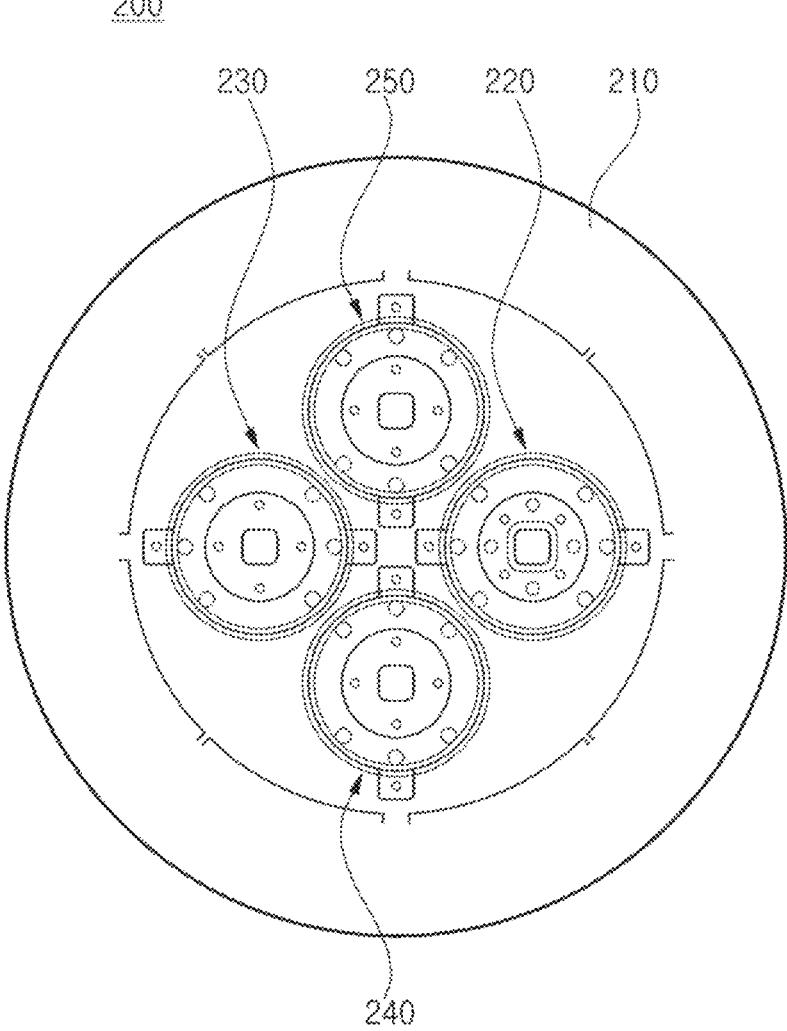
FIG. 10 is a bottom view illustrating a probe card according to an example embodiment.

FIG. 10 is a bottom view illustrating a probe card according to an example embodiment.

Referring to FIG. 10, a probe card 200 according to an example embodiment includes, for example, a main circuit board 210, a fixed core 220, a first movable core 230, a second movable core 240, and a third movable core 250.

The first to third movable cores 230, 240, and 250 may be configured in different types to perform electrical testing of different types of wafers. For example, each of the first to third movable cores 230, 240, and 250 may include components similar to the movable core 130 discussed above, and may be associated with a corresponding driving unit similar to the corresponding driving unit 140 discussed above.

Figure 11:
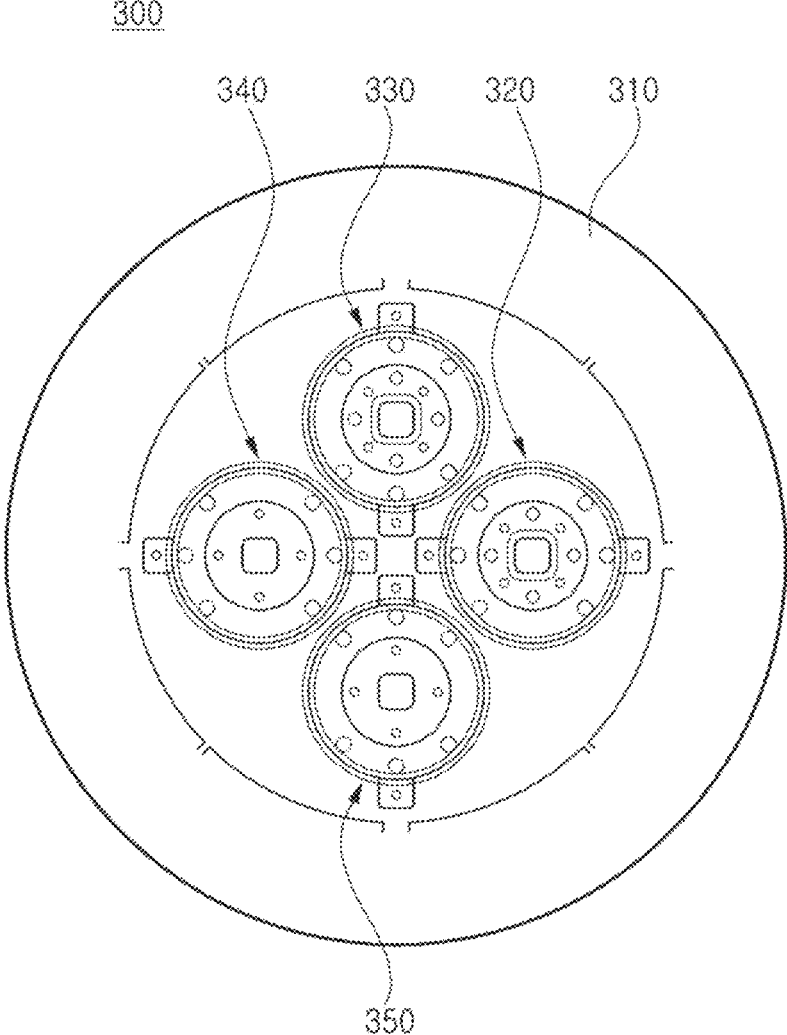
FIG. 11 is a bottom view illustrating a probe card according to an example embodiment.

FIG. 11 is a bottom view illustrating a probe card according to an example embodiment.

Referring to FIG. 11, a probe card 300 according to an example embodiment includes, for example, a main circuit board 310, a first fixed core 320, a second fixed core 330, a first movable core 340, and a second movable core 350. For example, each of the first and second movable cores 340 and 350 may include components similar to the movable core 130 discussed above, and may be associated with a corresponding driving unit similar to the corresponding driving unit 140 discussed above.

The first fixed core 320 and the second fixed core 330 may be configured to test electrical characteristics of the same type of wafer, and the first movable core 340 and the second movable core 350 may be configured to test electrical characteristics of a different type of water from that of the wafer tested by the first fixed core 320 and the second fixed core 330.

In this case, even if a defect occurs in any one of the first fixed core 320 and the second fixed core 330 and/or the first movable core 340 and the second movable core 350, testing may be performed on a product inspection without stopping the operation.

According to example embodiments a probe card is provided that is capable of performing testing without being replaced, even when testing electrical characteristics of different products.

While aspects of example embodiments have been shown and described above, it will be apparent to those skilled in the art that modifications and variations could be made without departing from the scope of the appended claims.

What is claimed is:

1. A probe card comprising:
   a main circuit board defining an opening;
   a fixed core provided on a bottom surface of the main circuit board;
   a movable core provided adjacent the fixed core and configured to move through the opening along a vertical direction; and
   a driver provided on an upper surface of the main circuit board and configured to control the movable core to move along the vertical direction,
   wherein the driver comprises a driving source provided on an installation portion of the main circuit board, and a power transmission member connected to the driving source and comprising a roller configured to contact the movable core, and
   wherein the driver is configured to move the movable core to control whether the fixed core or the movable core is in contact with a product, according to a type of the product.

2. The probe card of claim 1, wherein bottom surfaces of the fixed core and the movable core are provided at different levels along the vertical direction.

3. The probe card of claim 1, wherein the power transmission member comprises:
   a first power transmission member connected to the driving source and configured to rotate within a frame provided on the installation portion;
   a second power transmission member connected to the first power transmission member and configured to move along a horizontal direction based on rotation of the first power transmission member; and a third power transmission member provided between the second power transmission member and the movable core, wherein the third power transmission member comprises a shaft portion supported by the second power transmission member, and wherein the roller is provided on the shaft portion.

4. The probe card of claim 3, wherein the driving source comprises a direct current (DC) motor configured to rotate in first and second directions.

5. The probe card of claim 3, wherein the first power transmission member comprises a screw configured to rotate within the frame.

6. The probe card of claim 3, wherein the main circuit board comprises a body that has a circular plate shape and is formed of an insulator material, and a plurality of channels spaced apart from each other in a circumferential direction on an upper surface of the body, and wherein the plurality of channels are disposed around a circular region in which the fixed core and the movable core are disposed.

7. The probe card of claim 6, wherein the installation portion comprises a plurality of installation pillars provided in the circular region and a cover that has a circular plate shape and is connected to the plurality of installation pillars, and wherein a through-hole is formed through the cover above the movable core, and the roller of the third power transmission member is configured to pass through the through-hole and press the movable core.

8. The probe card of claim 6, wherein the plurality of channels comprises 48 channels, wherein 44 out of the 48 channels are electrically connected to the fixed core, and wherein 24 out of the 48 channels are electrically connected to the movable core.

9. The probe card of claim 3, further comprising a guide bar that is provided on the frame and configured to guide movement of the second power transmission member.

10. The probe card of claim 3, wherein the second power transmission member comprises an extension extending from a side surface thereof, and the driver further comprises a sensor provided on a moving path of the extension.

11. The probe card of claim 10, wherein the sensor is an ON/OFF sensor configured to detect whether the extension is in contact with the sensor.

12. The probe card of claim 10, wherein the sensor comprises a first sensor configured to detect whether the second power transmission member has moved forwards and a second sensor configured to detect whether the second power transmission member has moved backwards.

13. The probe card of claim 3, wherein the frame comprises a first frame in which the driving source is installed and a second frame spaced apart from the first frame, and wherein one end of the first power transmission member is connected to the driving source through the first frame, and another end of the first power transmission member is rotatably installed in the second frame.

14. The probe card of claim 1, wherein a bottom surface of the fixed core and a bottom surface of the movable core are provided at different levels along the vertical direction, and wherein the levels have a difference of 1000 μm or less.

15. The probe card of claim 1, wherein the movable core is configured to move within a range of 400 μm to 500 μm.

16. A probe card comprising:

a main circuit board comprising a plurality of channels spaced apart from each other in a circumferential direction;

a fixed core fixedly provided on a bottom surface of the main circuit board and electrically connected to the plurality of channels;

a movable core electrically connected to the plurality of channels, provided adjacent the fixed core, and configured to move along a vertical direction; and a driver connected to the movable core and configured to control the movable core to move along the vertical direction, wherein the driver is configured to move the movable core to control whether the fixed core or the movable core is in contact with a product, according to a type of the product, and wherein at least one of the plurality of channels is connected to both the fixed core and the movable core.

17. The probe card of claim 16, wherein the plurality of channels comprises 48 channels, wherein 44 out of the 48 channels are electrically connected to the fixed core, and wherein 24 out of the 48 channels are electrically connected to the movable core.

18. The probe card of claim 16, wherein the driver comprises a driving source provided on an installation portion of the main circuit board, and a power transmission member connected to the driving source and comprising a roller configured to contact and separate from the movable core.

19. The probe card of claim 18, wherein the power transmission member comprises:

a first power transmission member connected to the driving source and configured to rotate within a frame provided on the installation portion;

a second power transmission member connected to the first power transmission member and configured to move along a horizontal direction based on rotation of the first power transmission member; and a third power transmission member provided between the second power transmission member and the movable core, wherein the third power transmission member comprises a shaft portion supported by the second power transmission member, and wherein the roller is provided on the shaft portion.

20. A probe card comprising:

a main circuit board defining a first opening and a second opening;

a fixed core provided on a bottom surface of the main circuit board;

a first movable core provided adjacent the fixed core and configured to move through the first opening along a vertical direction;

a first driver provided on an upper surface of the main circuit board and configured to control the first movable core to move along the vertical direction;

a second movable core provided adjacent the fixed core and configured to move through the second opening along the vertical direction; and a second driver provided on the upper surface of the main circuit board and configured to control the second movable core to move along the vertical direction, wherein the first driver comprises a first driving source provided on an installation portion of the main circuit board, and a first power transmission member connected to the first driving source and comprising a first roller configured to contact the first movable core, wherein the second driver comprises a second driving source provided on the installation portion of the main circuit board, and a second power transmission member connected to the second driving source and comprising a second roller configured to contact the second movable core, and wherein the first driver and the second driver are configured to move the first movable core and the second movable core to control whether the fixed core, the first movable core or the second movable core is in contact with the product.

* * * * *